United States Patent
Palm et al.

(10) Patent No.: US 11,646,386 B2
(45) Date of Patent: May 9, 2023

(54) SOLAR MODULE WITH AN ENLARGED APERTURE AREA

(71) Applicant: CNBM RESEARCH INSTITUTE FOR ADVANCED GLASS MATERIALS GROUP CO., LTD., Bengbu (CN)

(72) Inventors: Joerg Palm, Munich (DE); René Kalio, Leipzig (DE)

(73) Assignee: CNBM RESEARCH INSTITUTE FOR ADVANCED GLASS MATERIALS GROUP CO., LTD., Bengbu (CN)

( * ) Notice: Subject to any disclaimer, the term of this patent is extended or adjusted under 35 U.S.C. 154(b) by 0 days.

(21) Appl. No.: 17/058,510

(22) PCT Filed: May 17, 2019

(86) PCT No.: PCT/CN2019/087360
§ 371 (c)(1),
(2) Date: Nov. 24, 2020

(87) PCT Pub. No.: WO2019/223609
PCT Pub. Date: Nov. 28, 2019

(65) Prior Publication Data
US 2021/0202773 A1    Jul. 1, 2021

(30) Foreign Application Priority Data
May 25, 2018 (EP) .................................. 18174444

(51) Int. Cl.
*H02S 40/34* (2014.01)
*H01L 31/05* (2014.01)

(52) U.S. Cl.
CPC .......... *H01L 31/0508* (2013.01); *H02S 40/34* (2014.12)

(58) Field of Classification Search
CPC ....... H01L 31/02021; H01L 31/022425; H01L 31/02013; H01L 31/0508; H01L 31/0201; H02S 40/34; H02S 40/36
See application file for complete search history.

(56) References Cited

U.S. PATENT DOCUMENTS

2008/0302030 A1    12/2008 Stancel et al.
2011/0017279 A1*   1/2011 Baumbach ........ H01L 31/02008
                                                    136/251
(Continued)

FOREIGN PATENT DOCUMENTS

CN    103053031 A    4/2013
CN    206194762 U    5/2017
(Continued)

OTHER PUBLICATIONS

English machine translation of Kuster et al. (WO 2014/086914), published Jun. 12, 2014.*
(Continued)

*Primary Examiner* — Christina Chern
(74) *Attorney, Agent, or Firm* — Bayramoglu Law Offices LLC

(57) ABSTRACT

A solar module with a flat substrate and a plurality of solar cells that are connected in series between two conductor tracks and are arranged on a first side of the substrate. The solar cells form an optically active module inner region that is surrounded by an optically inactive module edge region. A hole in the substrate, a junction box on a second side of the substrate, and an electrical connection between a tapping point on the conductor track and a connection point of the junction box are associated with each conductor track. The hole is positioned at least partially in the module inner region such that the tapping point on the conductor track is (Continued)

Figure 1:
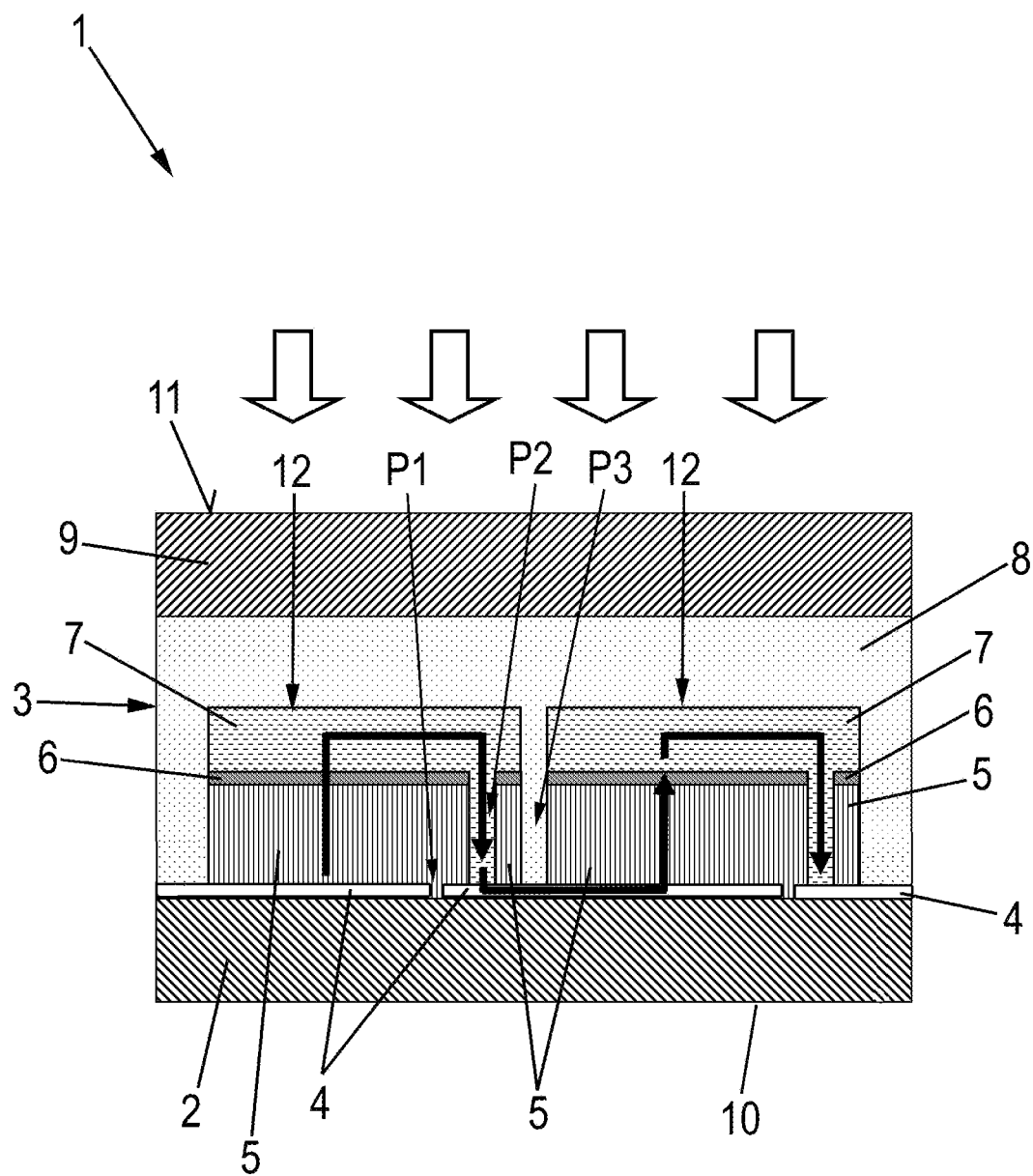

situated outside an aligning extension of the hole and at least one solar cell is divided or has a shortened length.

13 Claims, 9 Drawing Sheets

(56) References Cited

U.S. PATENT DOCUMENTS

| | | | | |
|---|---|---|---|---|
| 2013/0032207 A1* | 2/2013 | Oberrisser | ........ | H01L 31/02008 |
| | | | | 257/E31.124 |
| 2013/0167898 A1* | 7/2013 | Hong | .................. | H01L 31/0201 |
| | | | | 136/244 |
| 2013/0306146 A1 | 11/2013 | Sung et al. | | |
| 2014/0216526 A1 | 8/2014 | Doech et al. | | |
| 2016/0087134 A1 | 3/2016 | Kwon et al. | | |
| 2016/0240697 A1* | 8/2016 | Sung | .................. | H01L 31/0201 |

FOREIGN PATENT DOCUMENTS

| | | | | |
|---|---|---|---|---|
| EP | 2761673 A1 | | 8/2014 | |
| JP | 2011124435 A | * | 6/2011 | |
| JP | 2011124435 A | | 6/2011 | |
| JP | 2014175564 A | | 9/2014 | |
| WO | 2013/045682 A1 | | 4/2013 | |
| WO | WO-2014086914 A1 | * | 6/2014 | ........... H01L 31/188 |

OTHER PUBLICATIONS

Definition of "frame" from Merriam-Webster retrieved from https://www.merriam-webster.com/dictionary/frame on Jan. 13, 2022.*
English machine translation of Terashita et al. (JP 2011-124435) published Jun. 23, 2011.*
International Search Report for International PCT Application No. PCT/CN2019/087360 filed on May 17, 2019, on behalf of Bengbu Design & Research Institute for Glass Industry Co., Ltd. dated Aug. 19, 2019. 4 pages.
Written Opinion for International PCT Application No. PCT/CN2019/087360 filed on May 17, 2019 on behalf of BENGBU DESIGN & Research Institute for Glass Industry Co., Ltd. dated Aug. 19, 2019. 4 pages.

* cited by examiner

SOLAR MODULE WITH AN ENLARGED APERTURE AREA

CROSS-REFERENCE TO RELATED APPLICATIONS

The present application is the U.S. National Stage of International Patent Application No. PCT/CN2019/087360 filed on May 17, 2019 which, in turn, claims priority to European Patent Application No. EP 18174444.2 filed on May 25, 2018.

The present invention is in the technical field of photovoltaic energy generation and relates to a solar module with an aperture area that is enlarged in comparison with the aperture area of prior art solar modules with the same dimensions.

The generation costs for current from photovoltaics depend on various contributing factors. In addition to the production costs of the components of the entire system, properties of the solar module such as power output, temperature coefficient, and low-light performance enter in. Moreover, the service life of the components and of the entire system constitutes a substantial impacting factor. Since the generation costs are ultimately crucial to the economic success of a photovoltaic system and significantly influence competition with other energy forms, such as wind energy, fossil fuels, or nuclear energy, reliability and service life must be optimized in the development of the solar modules, in addition to the costs and the power output. It has been demonstrated in practice that for satisfactory fulfillment of the requirements for costs, power output, and service life, compromises must often be found since the measures required frequently have an impact contrary to these requirements.

In principle, with solar modules, the optically active useful area (aperture area) is smaller than the outer dimensions of the solar module since the edge region must be protected against moisture by edge sealing and thus cannot be used for photovoltaic energy production. In addition, the insulation section between the inside and the outside of the solar module must be large enough to comply with all technical standards and pass certification tests. Added to that is the area requirement for the contacting of solar modules connected in series. In the case of a thin-film solar module with monolithic serial connection of the solar cells, the electrical power output is picked up by two busbars arranged on the two long sides of the module, which busbars are typically implemented in the form of contact strips. For an external electrical contact of the solar module, two junction boxes are typically provided on the back side of the module, wherein, according to a conventional design the contact strips are contacted through two holes in the substrate glass that are positioned overlapping the contact strips.

In order to make the aperture area as large as possible, the optically inactive edge region must be as narrow as possible. However, the edge sealing must be sufficiently wide to protect the inside of the solar module long-term against moisture penetrating from the edge. Also, it must be taken into account that the contact strips are moved farther outward with narrowing of the edge region and so are the holes in the substrate glass overlapping the contact strips for contacting the conductor tracks with the junction boxes. However, when the holes move closer to the module edge, the risk of glass breakage during production or with mechanical stress due to wind and snow loads in practical use is significantly increased.

Also known are solar modules in which the two contact strips are in each case routed along the module side edge to a hole in the substrate glass, threaded through it, and contacted in a common junction box. Disadvantageous in this approach is the relatively large space requirement for the two contact strips on the module edge, resulting in a significant reduction of the optically active useful area. In addition, the production process is relatively complex. Compounding the problem is the fact that depending on the assembly type (with or without a frame, with back side rails or clamps), higher mechanical stresses can arise on the short module side, which can result in breakage in the practical use.

Further known are solar modules in which the contact strips are routed out on the side between the two substrates of the solar module and routed together to the center on the back substrate. This assumes, however, that the contact strips and the exit regions are adequately insulated electrically and protected against moisture. This is usually realized by a back side film, which, however, causes additional relatively high costs.

In contrast, the object of the present invention consists in advantageously providing solar modules known in the prior art with an enlarged aperture area without the disadvantages described in the introduction occurring. In addition, economical and efficient industrial series production of the solar modules should be possible using conventional methods.

These and other objects are accomplished according to the proposal of the invention by a solar module according to the independent claim. Advantageous embodiments of the invention are indicated through the characteristics of the dependent claims.

Presented according to the invention is a solar module with solar cells for photovoltaic energy generation electrically connected in series. In principle, the solar module according to the invention can be any type of solar module. Preferably, it is a thin-film solar module with serially connected solar cells in monolithically integrated form. Preferably, the thin-film solar module has a composite pane structure, wherein a back carrier substrate and a front covering (e.g., glass sheets) are fixedly bonded to one another via a thermoplastic or elastomeric intermediate layer (e.g., a PVB layer). Preferably, the thin-film solar module has a substrate configuration, in which the layer structure for forming the solar cells is applied on a surface of a back carrier substrate facing the light-entry-side. The carrier substrate and the covering can be made, for example, of glass, plastic, metal, or a metal alloy. Typically, at least the carrier substrate is implemented as a rigid sheet. Preferably, the carrier substrate is made of glass. Preferably, the covering is also made of glass.

The layer structure of the thin-film solar module comprises, in a manner known per se, a back electrode layer, a front electrode layer, and an optically (photovoltaically) active absorber layer arranged between the back and the front electrode layer. The front electrode layer is optically transparent, since passage of light through to the layer structure must be enabled. The front electrode layer typically includes or is made of a doped metal oxide (TCO=transparent conductive oxide), for example, n-conductive, in particular aluminum-doped, zinc oxide (AZO). Preferably, the absorber layer includes or is made of a chalcopyrite semiconductor, advantageously a ternary I-III-VI-compound semiconductor from the group copper indium/gallium disulfide/diselenide $(Cu(In,Ga)(S,Se)_2)$. In the above formula, indium and gallium each can be present alone or in combination. The same is true for sulfur and selenium, each of which can be present alone or in combination. The absorber layer typically has doping of a first conductor type (i.e., charge carrier type) and the front electrode has doping of the opposite conductor type. Generally speaking, the absorber layer is p-conductive (p-doped), i.e., has an excess of defect electrons; and the front electrode layer is n-conductive (n-doped), such that free electrons are present in excess. A buffer layer is typically arranged between the absorber layer and the front electrode layer. This is true in particular for absorber layers based on $Cu(In,Ga)(S,Se)_2$, with which, generally speaking, a buffer layer is required between a p-conductive $Cu(In,Ga)(S,Se)_2$ absorber layer and an n-conductive front electrode. The buffer layer enables electronic adaptation between the absorber and the front electrode. Moreover, it offers protection against sputtering damage in a subsequent process step of deposition of the front electrode, for example, by DC magnetron sputtering. By means of the succession of an n-conductive front electrode layer, a buffer layer, and a p-conductive absorber layer, a p-n-heterojunction is formed, in other words, a junction between layers of the opposite conductor type. The absorber layer can, for example, also be made of cadmium telluride (CdTe). The back electrode layer is typically deposited onto the carrier substrate. The back electrode layer typically includes or is made of molybdenum (Mo), but other metals can also be used.

Solar cells connected in series by patterning lines are formed in the layer structure of the thin-film solar module. Here, (at least) the back electrode layer is divided into sections by first patterning lines (P1 lines), which sections form the back electrodes of the solar cells. Also, (at least) the absorber layer is divided into sections by second patterning lines (P2 lines), which sections form the optically active regions (absorbers) of the solar cells, and (at least) the front electrode layer is divided into sections by third patterning lines (P3 lines), which sections form the front electrodes of the solar cells. Adjacent solar cells are electrically connected to one another in serial connection via electrically conductive material in the second patterning lines, wherein the front electrode of one solar cell is electrically connected to the back electrode of the adjacent solar cell and, typically, but not mandatorily, has direct physical contact therewith. Each patterning zone includes a direct succession of the three patterning lines P1-P2-P3, in this order in each case.

In keeping with the customary usage, the term "solar cell" refers to a region of the layer structure that has a front electrode, an absorber, and a back electrode and is delimited by two patterning zones directly adjacent one another. This applies analogously in the edge region of the module, wherein, instead of a patterning zone, there is a connection section for electrically contacting the serial connection of the solar cells.

The solar module according to the invention comprises an optically (photovoltaically) active inner region that is formed by the solar cells, and an optically (photovoltaically) inactive edge region that surrounds the inner region (at the module level). Of course, the optically active inner region also includes optically inactive regions, in particular the patterning zones with the P1/P2/P3 lines for forming the solar cells. The inner region corresponds to the optically active useful area (aperture area) of the solar module. Typically, the inner region (aperture area) has a rectangular shape corresponding to the rectangular shape of the plurality of series-connected solar cells. Preferably, the solar module (i.e. inner region of the solar module) comprises only one string of series-connected solar cells, i.e. the inner region has no separating line(s) extending along the direction of series-connection completely separating the solar cells into several parallel solar cell strings. Accordingly, the solar module preferably has no parallel solar cell strings.

Generally speaking, the layer structure is, in the edge region within a zone adjoining the module edge, which is customarily referred to as "edge de-coating", completely removed or not deposited. Moreover, an edge sealing adjacent the module edge, as well as, positioned farther inward, the two busbars or conductor tracks for the electrical contacting of the solar cells are situated in the edge region. The solar cells are arranged in serial connection between the two conductor tracks. The conductor tracks are, for example, implemented in the form of contact strips. Advantageously, the back electrode layer extends into the optically inactive edge region, wherein the two conductor tracks are arranged in each case on and in electrical contact with the back electrode layer, in order to pick up the current generated by the solar cells. The conductor tracks are connected to the series-connected solar cells (preferably only one string of solar cells). The series-connected solar cells are arranged to series-connect the conductor tracks. The conductor tracks do not electrically connect the solar cells in a parallel manner, i.e. the conductor tracks do not connect two or more solar cells or two or more strings of series-connected solar cells in a parallel electrical connection.

Generally, the solar module according to the invention comprises a flat (carrier) substrate, preferably a rigid glass sheet, as well as a plurality of solar cells that are connected in series between a first and a second conductor track and arranged on a first side (inner side) of the substrate. Preferably, the substrate is flat and has a rectangular shape. Likewise, the solar module preferably has a rectangular shape. The solar cells preferably have in each case a rectangular shape. Preferably, the two conductor tracks are in each case contact strips. Preferably, the two conductor tracks extend in each case along a first dimension of the module or substrate, which is typically the length of the solar module, whereas the solar cells are arranged along a second dimension, which is typically the (usually shorter) width of the solar module. Typically, the second dimension is oriented perpendicular to the first dimension. Preferably, the two conductor tracks are in each case electrically connected to the back electrode layer, in particular arranged directly on the back electrode layer. The solar module comprises an optically active (module) inner region, which results from the solar cells, and an optically inactive (module) edge region, which surrounds the inner region (at the module level) (perpendicular in view through the substrate). Typically, the inner region and the aperture area formed by the inner region have a rectangular shape.

In the solar module according to the invention, the following are associated in each case with the two conductor tracks (i.e., separately with each conductor track):
 a (through) hole in the substrate,
 a junction box on a second side of the substrate,
 an electrical connection between a tapping point on the conductor track and a connection point of the junction box.

The two junction boxes are arranged in each case on an (outer) second side of the substrate. Typically, each junction box overlays the associated hole in the substrate. Each junction box is thus arranged on the second side (i.e. on the surface) of the substrate and is not arranged in the associated hole, i.e. is arranged completely outside the hole. Specifically, the two junction boxes are placed on the second side (surface) of the substrate and are not laminated into the substrate (also not partially laminated into the substrate).

In the context of the present invention, the term "tapping point" refers to the point on the respective conductor track at which the current is tapped from the conductor track and conducted to the associated connection point. At the tapping point, the current is diverted from the conductor track in a direction that is different from the orientation of the respective conductor track, in other words, diagonal or at a right angle relative to the orientation of the conductor track.

In the solar module according to the invention, the two holes in the substrate are in each case at least partially, in particular completely, positioned in the inner region of the module such that the associated tapping point on the conductor track is situated outside an aligning extension of the hole. Thus, the hole in the substrate is situated not overlapping the associated tapping point on the conductor track, in other words, not over the tapping point. Instead, the tapping point is situated outside a region that results from an extension of the first hole perpendicular to the flat substrate. The tapping point is also thus situated not in direct view through the associated hole. Also, the two holes are moved inward in each case such that at least one solar cell, in particular a plurality of solar cells are divided in each case into two solar sub-cells or, with edgeward positioning of the respective hole, (in contrast to the solar cells not affected by the hole) have in each case a shortened length. In addition, a further solar cell adjacent a completely divided solar cell can be shortened. At the time of the formation of the holes, the back electrode layer situated on the substrate is simultaneously removed such that the layer region below the two holes can, in principle, no longer be used for photovoltaic energy generation.

Thus, according to the invention, the position of the two holes in the substrate is physically separated from the position of the respective associated tapping point on the conductor track. Advantageously, this enables placing the conductor tracks farther on the edge of the solar module, wherein care must be taken that the solar module, with a reduced width of the optically inactive edge region, again have sufficient insulating strength and climate stability. To be sure, the inward moving of the two holes reduces the optically active area of the solar module (by dividing at least one solar cell into two solar sub-cells or shortening the length of at least one solar cell); however, the aperture area can be significantly enlarged overall by a narrowing of the edge region. In this way, more current can be generated with a given module size; and the generation costs of the current are advantageously reduced. This is an important advantage of the solar modules according to the invention compared to prior art solar modules, in which the tapping points of the two conductor tracks are positioned in each case in an aligning extension of an associated hole in the substrate.

In an advantageous embodiment of the solar module according to the invention, the two holes in the substrate are in each case moved far enough inward that they have a distance from the respective associated conductor track of 1% to 10%, in particular 5% to 10%, of the distance between the two conductor tracks. As a result, the optically active area of the solar cells is only reduced relatively little by the positioning of the two holes, while, overall, a particularly good enlargement of the aperture area can be achieved by narrowing the edge region.

Advantageously, with a thin-film solar module with a layer structure applied on the substrate, the two holes in the substrate are arranged in each case in or over a (de-coating) zone of the layer structure (at the module level viewed at a right angle through the module), in which all layers are removed or not applied at least all the way to the back electrode layer, in particular all the way to the back electrode layer. Preferably, the (de-coating) zone includes a section that is implemented in the form of an indentation of the inner region. The positioning of the two holes in the inner region that results in the fact that at least one solar cell, in particular a plurality of solar cells, are divided in each case into two solar sub-cells by the respective (de-coating) zone or have, in the case of an edgeward position of the (de-coating) zone, in each case a shortened length. A solar cell adjacent a divided solar cell can be cut short.

In an advantageous embodiment of the solar module according to the invention, the electrical connection associated in each case with the two holes in the substrate has, on the first side of the substrate, a flat contact element electrically connected to the associated conductor track, which contact element spans the associated through-hole at least partially, in particular completely. The two flat contact elements are, for example, implemented as contact pads or contact strips. The flat contact element can be distinct from the associated conductor track, but can, alternatively, also be a part of the associated conductor track (end section or intermediate section).

The two flat contact elements are in each case electrically connected to the associated conductor track and enable particularly simple contacting from the outside by means of a contact stamp pushing through the associated hole in the substrate in order to route the current diverted by the respective tapping point to the associated junction box. Accordingly, in accordance with a preferred embodiment of the solar module according to the invention, the flat contact element that spans the associated hole in the substrate at least partially, in particular completely, is electrically contacted by a contact stamp of the associated junction box extending through the hole. The two contact stamps are in each case a component of the associated junction box and contact the respective flat contact element in a direct line of sight through the hole, in other words, in a lengthened region aligned with the hole. Such a junction box can be found, for example, in European patent application EP 12778258.9, whose full content is referenced here.

According to an embodiment of the solar module according to the invention, the flat contact element directly contacts a layer section of the back electrode layer electrically connected to the associated conductor track. Essential here is the fact that, at least in the inner region, the layer section is electrically isolated from the solar cells in order to avoid a short-circuit of the solar cells. This can be done in a simple manner by a separating line cutting through the back electrode layer, which line electrically isolates the layer section, at least in the inner region, from a remaining section of the back electrode layer. Advantageously, such electrical isolation of the layer section from the solar cells is also done in the edge region, for which purpose, for example, the separating line extends all the way to the associated conductor track.

The flat contact elements are in each case arranged in physical contact with the back electrode layer, in other words, make direct contact with the back electrode layer. Preferably, the two contact elements are in each case secured to the back electrode layer, which can preferably be done by soldering, welding, or gluing. This measure is advantageous in particular in the case of mechanical stressing of the flat contact element in the case of external contacting by the contact stamp of the junction box.

According to a first variant of the preceding embodiment of the invention, the flat contact element is physically spaced apart from the associated conductor track, with an electrical connection to the conductor track made via the layer section of the back electrode layer electrically contacted by the contact element. This variant has the particular advantage that the height of the layer stack is not increased in the region of the conductor track. In addition, material can be saved.

According to a second variant of the preceding embodiment of the invention, the flat contact element is in physical contact, in particular in overlap, with the associated conductor track. This means that the flat contact element extends all the way to the associated conductor track. Advantageously, the two flat contact elements are in each case secured to the associated conductor track, for example, by soldering, welding, or gluing. The flat contact element can optionally be attached either to the light-entry-side surface or to the surface facing away from the light-entry-side of the associated conductor track.

According to another embodiment of the solar module according to the invention, in which the two conductor tracks are implemented as contact strips and extend in each case along a first dimension of the substrate, wherein the solar cells are arranged along a second dimension, the electrical connection comprises in each case an end section or an intermediate section of the associated conductor track, which section deviates from the direction along the first dimension and extends diagonally or at a right angle to the first dimension. Here, the end section or the intermediate section is routed through the associated hole on the second side of the substrate and electrically connected to the connection point of the associated junction box. Advantageously, in the case of this embodiment of the invention, no separate flat contact elements are necessary and the current can be diverted via the respective end section or the intermediate section of the conductor track implemented as a contact strip. An advantage of such an embodiment is the avoidance of a relatively long contact lug mounted on the busbar, which could possibly be pressed out of its target position by polymer flow during lamination. In addition, there is no risk of the connection, in particular welding, between the contact lug and the busbar becoming detached.

According to a first variant of the preceding embodiment of the solar module according to the invention, the end section or the intermediate section of the respective conductor track directly contacts a layer section of the back electrode layer electrically connected to the conductor track, wherein the layer section is, at least in the inner region, electrically isolated from the solar cells, for example, by a separating line.

According to a second variant of the preceding embodiment of the solar module according to the invention, all layers of the layer structure are removed or are not applied in the region of the end section or the intermediate section of the conductor track.

According to another embodiment of the solar module according to the invention, the tapping point is spaced apart from an end of the associated conductor track by a distance that corresponds to 20% to 50% of a length of the conductor track. By this measure, ohmic losses in the conductor track can be advantageously reduced since the average length of the current path along the conductor track is shortened. This advantageously enables a reduction of the cross-sectional surface of the conductor track by reducing the width and/or thickness with accompanying advantages for encapsulation as well as, particularly advantageously, further enlargement of the optically active area (aperture area).

In the solar module according to the invention, by means of the positioning of the two holes in the substrate, at least one solar cell in each case is divided into two solar sub-cells or has a shortened length. Particularly advantageously, the solar cells are implemented such that they have an optically active area of the same size. In particular, for this purpose, those solar cells that are divided into two solar sub-cells by the positioning of the two holes in the substrate or have a shortened length have in each case a greater width (dimension in the direction of the serial connection of the solar cells) than the remaining solar cells. By means of this measure, it can be advantageously achieved that all solar cells are operated at at least almost the same operating point on their characteristic curve such that the efficiency of the solar cells affected by the arrangement of the holes is not degraded relative to the remaining solar cells.

The various embodiments of the invention can be realized individually or in any combinations desired. In particular, the features mentioned above and those to be explained in the following can be used not only in the combinations indicated but also in other combinations or in isolation without departing from the scope of the present invention.

Figure 2:
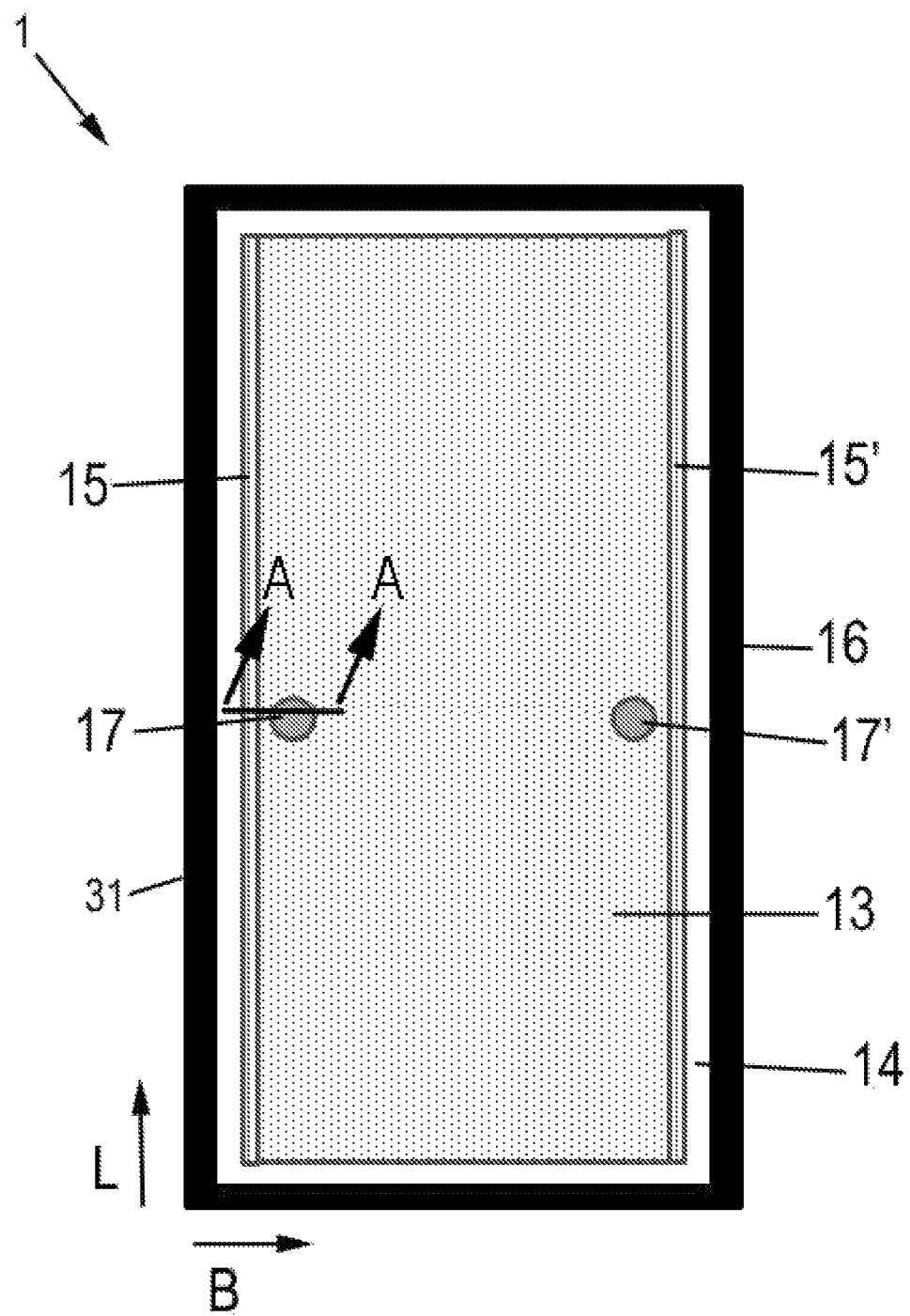
Figure 3:
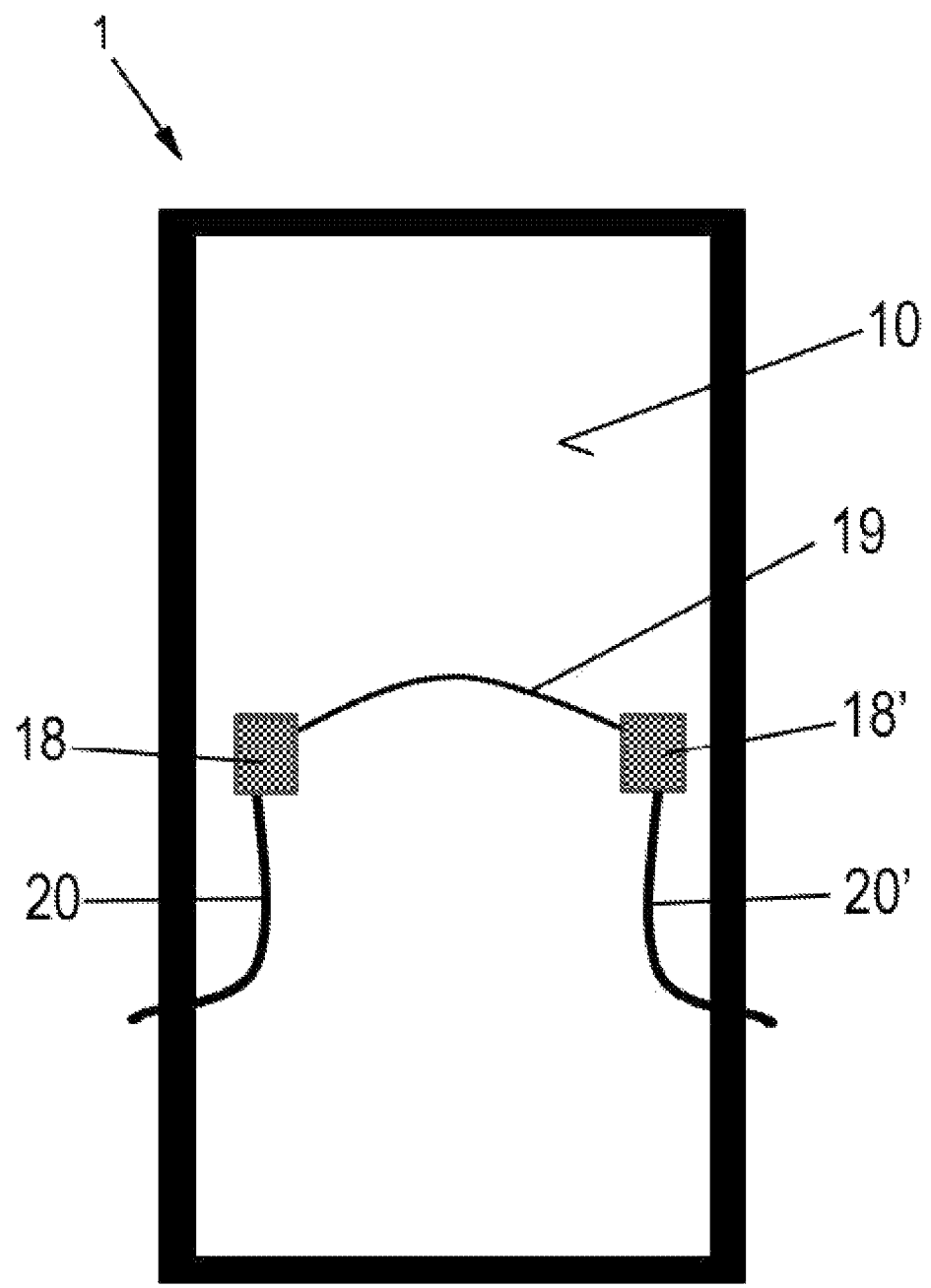
Figure 4:
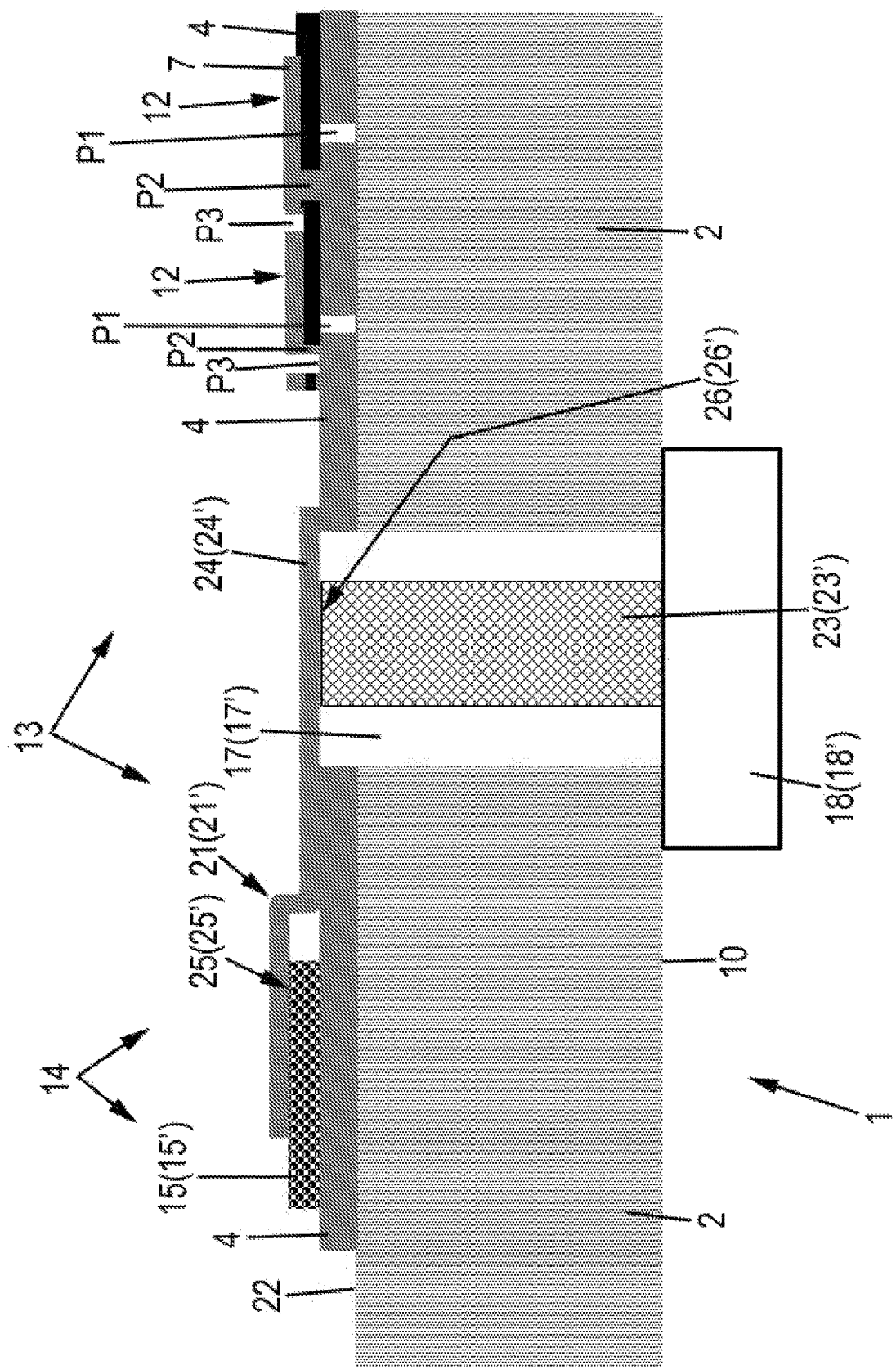
Figure 5:
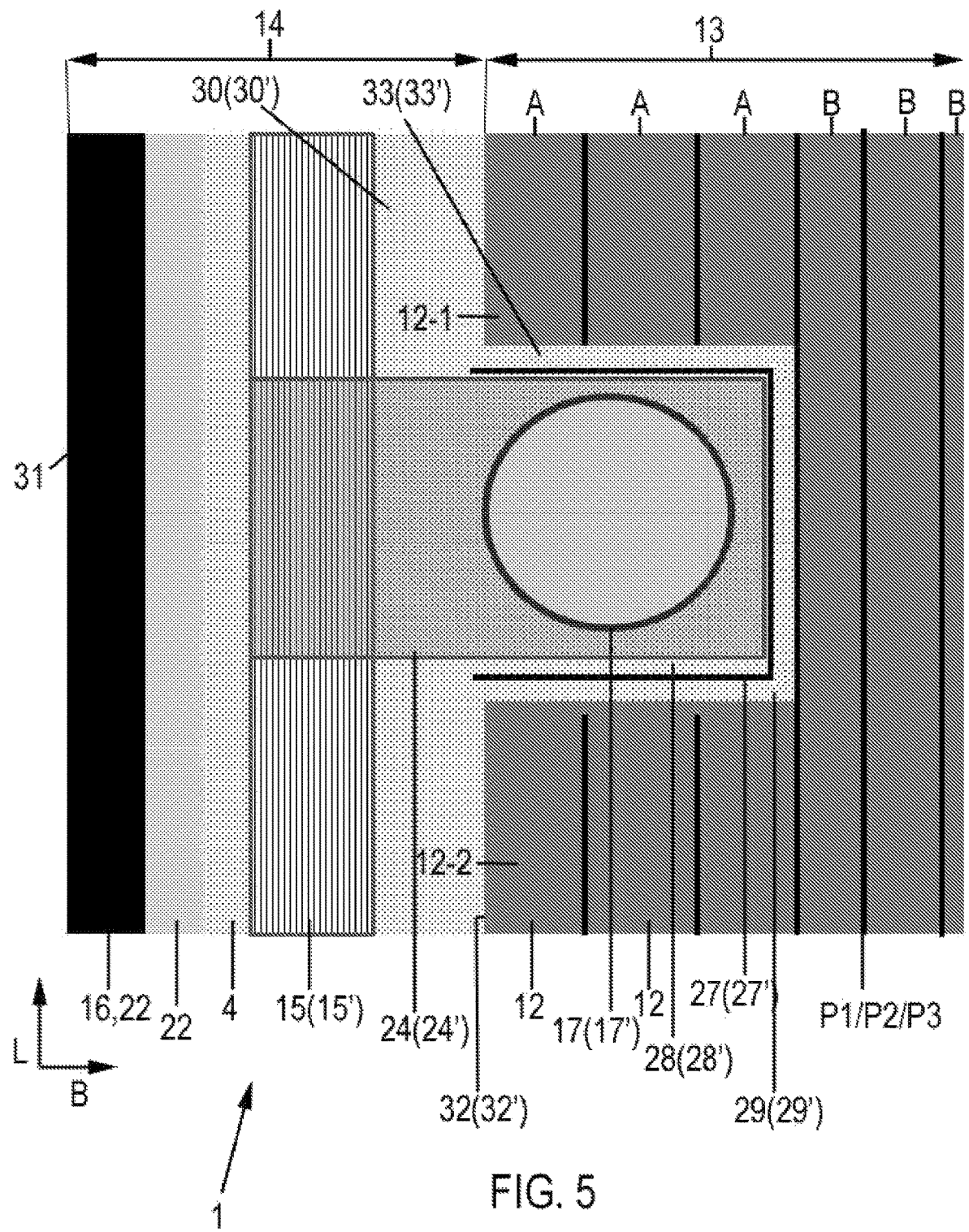
Figure 6:
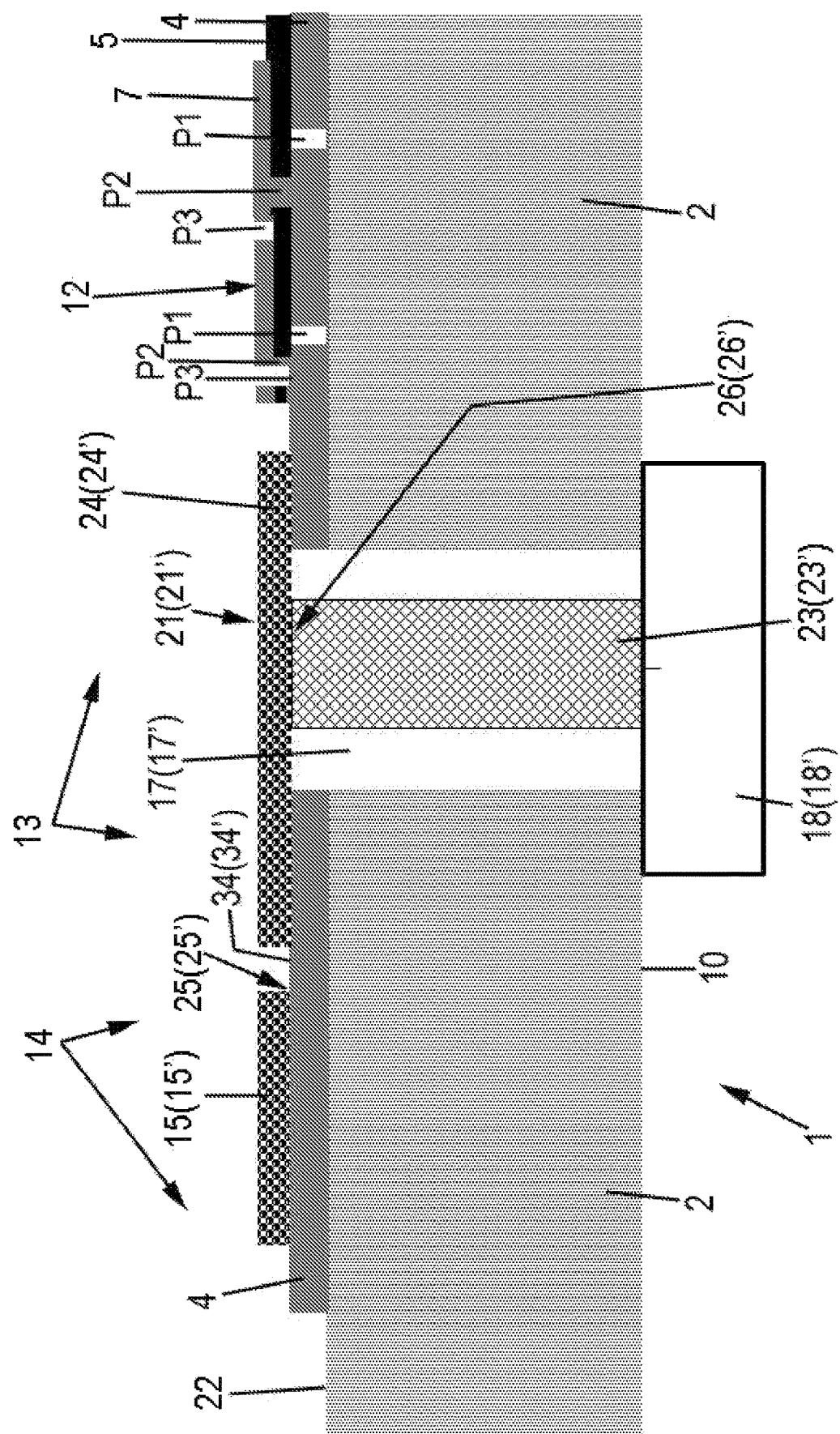
Figure 7:
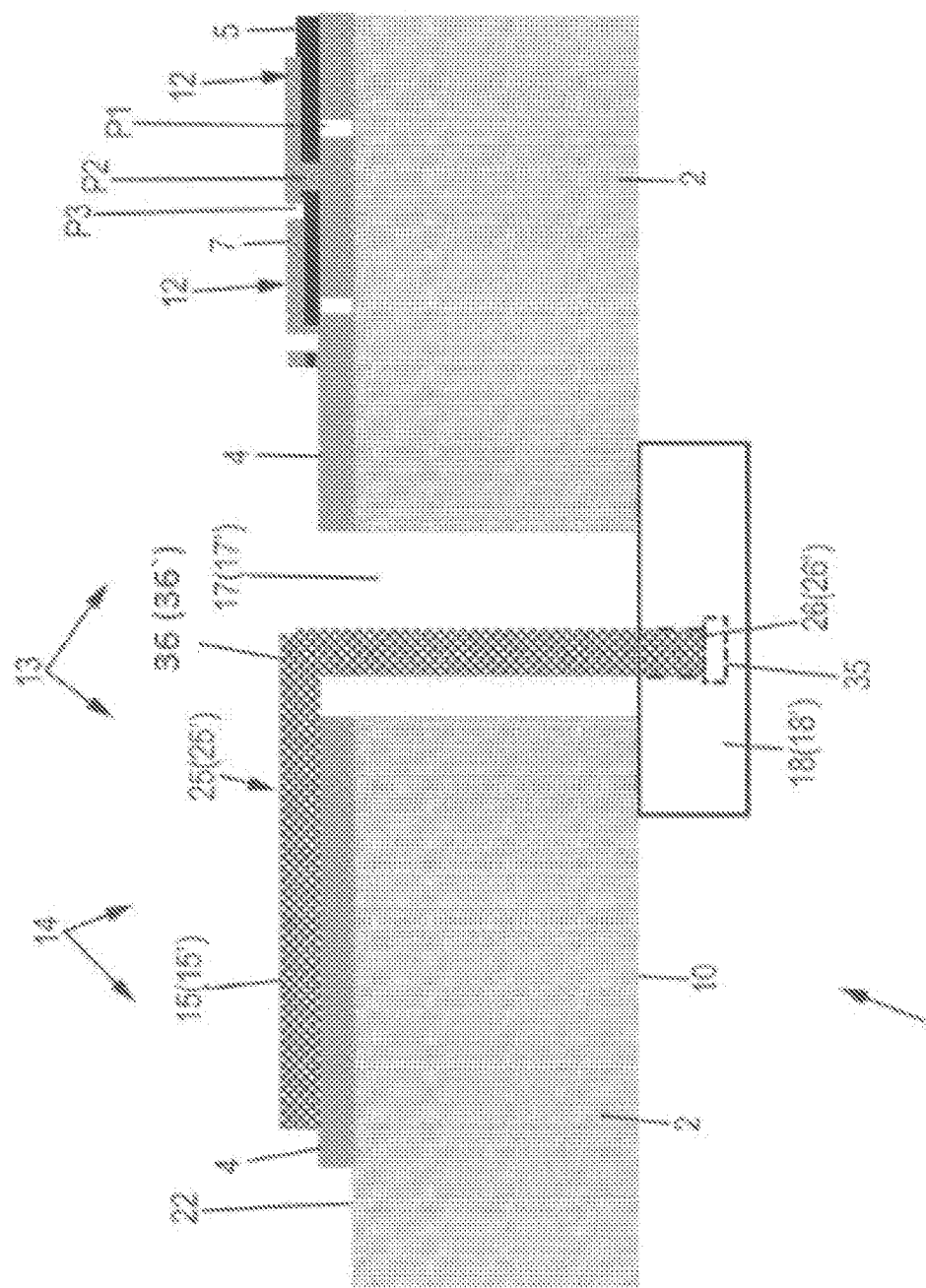
Figure 8:
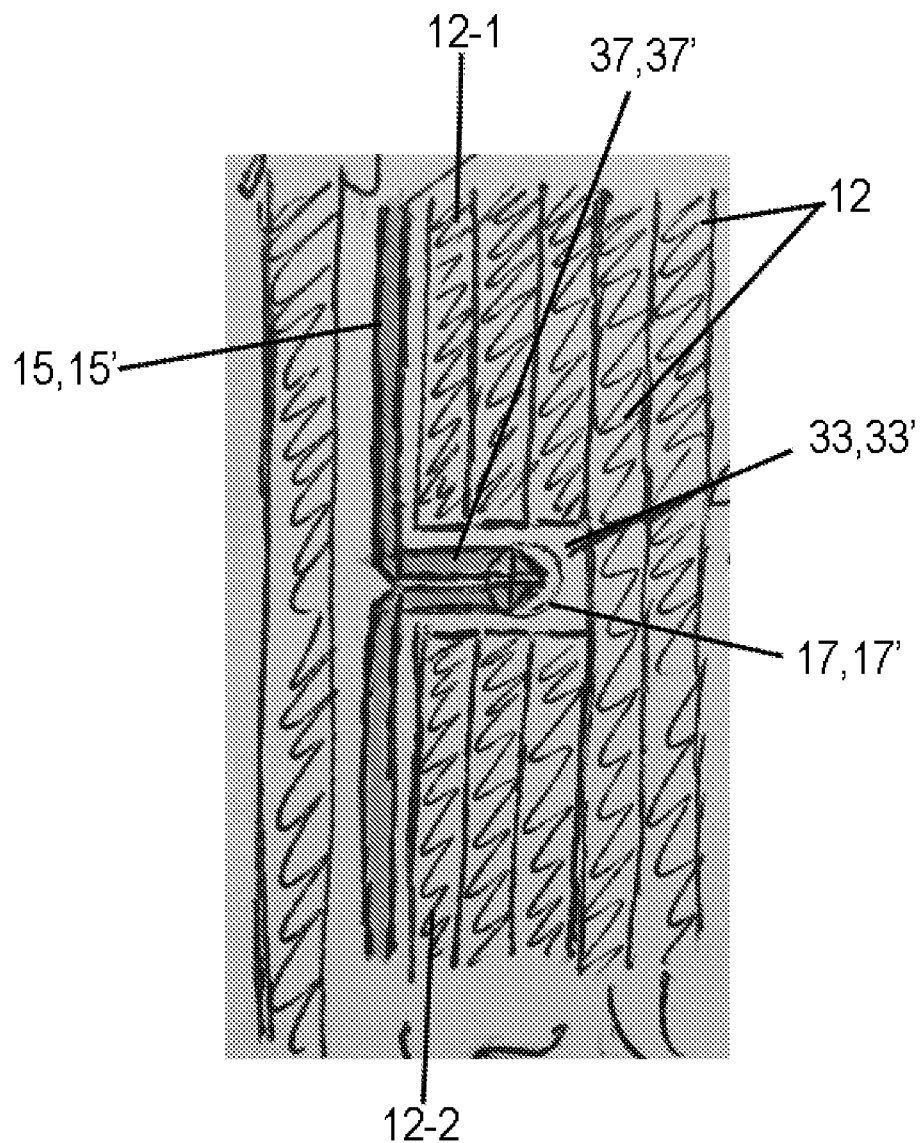
Figure 9:
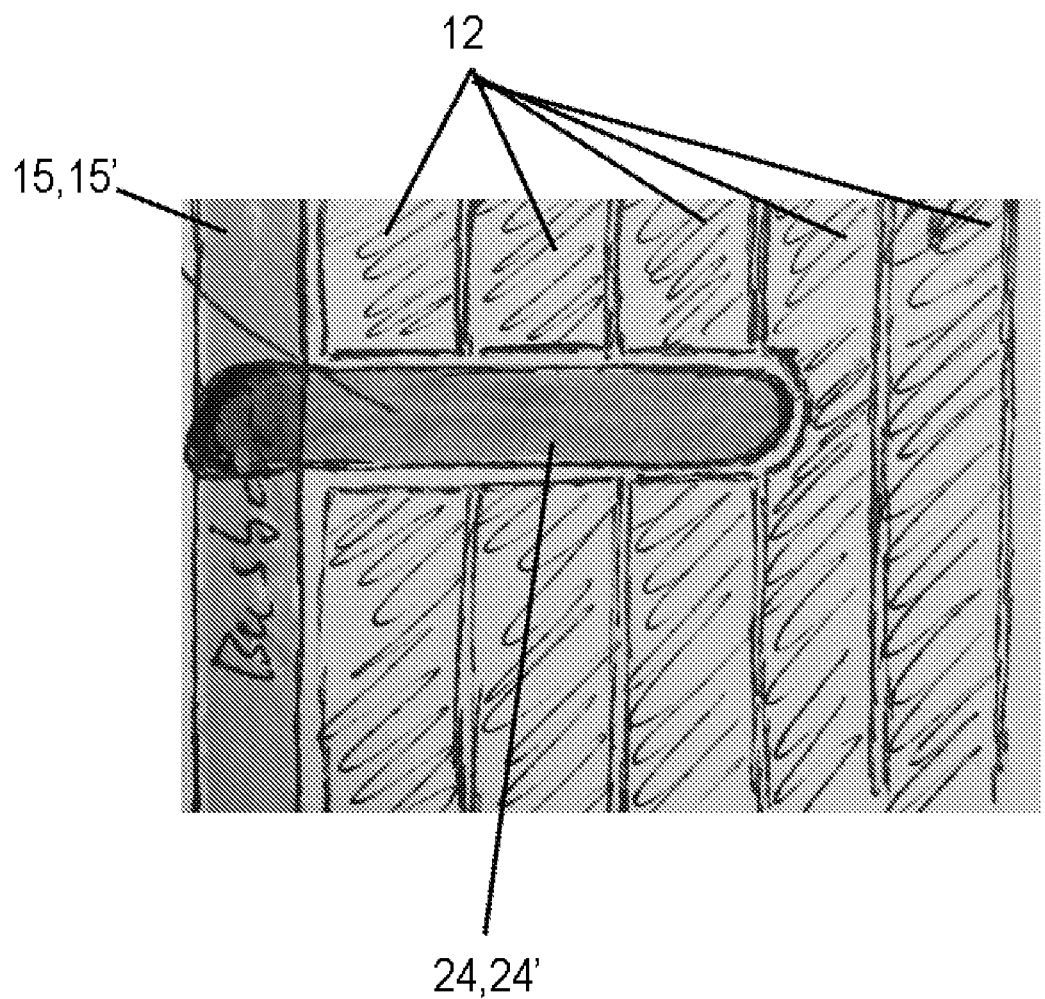

The invention is now explained in detail using exemplary embodiments, referring to the accompanying figures. They depict, in simplified, not to scale representation:

FIG. 1 a schematic cross-section for illustrating an exemplary structure of the thin-film solar module according to the present invention;

FIG. 2 a schematic back view of the thin-film solar module of FIG. 1 without junction boxes;

FIG. 3 a schematic back view of the thin-film solar module of FIG. 1 with junction boxes;

FIG. 4 a schematic cross-sectional representation of a first variant of the thin-film solar module of FIG. 1 according to section line A-A of FIG. 2;

FIG. 5 a plan view in the region of the schematic cross-sectional representation of FIG. 4;

FIG. 6 a schematic cross-sectional representation of a second variant of the thin-film solar module of FIG. 1 according to section line A-A of FIG. 2;

FIG. 7 a schematic cross-sectional representation of a third variant of the thin-film solar module of FIG. 1 according to section line A-A of FIG. 2;

FIG. 8 a schematic representation in plan view of a fourth variant of the thin-film solar module of FIG. 1;

FIG. 9 a schematic representation in plan view of a fifth variant of the thin-film solar module of FIG. 1.

DETAILED DESCRIPTION OF THE DRAWINGS

FIG. 1 schematically illustrates the structure of a thin-film solar module according to the invention referenced as a whole with the number 1 in a cross-sectional view (cut perpendicular to the module surface). The thin-film solar module 1 comprises a plurality of solar cells 12 serially connected to one another in integrated form, wherein, in a greatly simplified manner, only two solar cells 12 are depicted. Of course, generally speaking, in the thin-film solar module 1, a large number of solar cells 12 (for example, approx. 100-150) are serially connected.

The thin-film solar module 1 has a composite pane structure in substrate configuration. It comprises a back carrier substrate 2 with a layer structure 3 of thin layers applied thereon, wherein the layer structure 3 is arranged on a light-entry-side surface of the carrier substrate 2. The opposite surface of the carrier substrate 2 forms the back side 10 of the solar module 1. Here, the carrier substrate 2 is, for example, implemented as a rigid (planar) glass sheet with relatively high permeability to light, whereas other electrically insulating materials with desired stability and inert behavior relative to the process steps carried out can equally be used.

The layer structure 3 includes an opaque back electrode layer 4, which is made, for example, from a light impermeable metal such as molybdenum (Mo) and was applied directly on the carrier substrate 2 by vapor deposition or magnetron enhanced cathodic sputtering (sputtering). The back electrode layer 4 has, for example, a layer thickness in the range from 300 nm to 600 nm. Applied on the back electrode layer 4 is an optically (photovoltaically) active absorber layer 5 that is made of a semiconductor doped with metal ions whose band gap is capable of absorbing the greatest possible share of sunlight. The absorber layer 5 is made of a p-conductive chalcopyrite semiconductor, for example, a compound of the group Cu(In/Ga) $(S/Se)_2$, in particular sodium (Na)-doped Cu(In/Ga) $(S/Se)_2$. The absorber layer 5 has a layer thickness, which lies, for example, in the range from 1-5 µm and is, in particular, approx. 2 µm. Typically, for producing the absorber layer 5, various material layers are applied, for example, by sputtering, which layers are subsequently thermally converted to form the compound semiconductor by heating in a furnace, optionally in an atmosphere containing S and/or Se (RTP=rapid thermal processing). This manner of production of a compound semiconductor is well known to the person skilled in the art such that it need not be discussed in detail here. Deposited on the absorber layer 5 is a buffer layer 6, consisting here, for example, of a single layer of cadmium sulfide (CdS) and a single layer of intrinsic zinc oxide (i-ZnO), not depicted in detail in FIG. 1. A front electrode layer 7 is applied on the buffer layer 6, for example, by sputtering. The front electrode layer 7 is transparent to radiation in the visible spectral range ("window electrode") such that the incoming sunlight is weakened only slightly. The front electrode layer 7 is based, for example, on a doped metal oxide, for example, n-conductive aluminum (Al)-doped zinc oxide (ZnO). Such a front electrode layer 7 is generally referred to as a TCO layer (TCO=transparent conductive oxide). The layer thickness of the front electrode layer 7 is, for example, approx. 500 nm. The front electrode layer 7 together with the buffer layer 6 and the absorber layer 5 form a heterojunction (i.e., a succession of layers of the opposite conductor type).

For protection against environmental influences, a (plastic) adhesive layer 8, which serves, in particular, to encapsulate the layer structure 3, is applied on the front electrode layer 7. The carrier substrate 2 is fixedly bonded ("laminated") by the adhesive layer 8 to a front covering 10, wherein the adhesive layer 8 is implemented here, for example, as a thermoplastic adhesive layer that is plastically reshapeable by heating and, upon cooling, fixedly bonds the covering 9 and the carrier substrate 2 to one another. The adhesive layer 8 is made here, for example, of PVB. The covering 9 is transparent to sunlight and is implemented, for example, as a rigid (planar) glass sheet of extrawhite glass with low iron content. The covering 9 serves for sealing and as mechanical protection of the layer structure 3 and forms an outer surface 11 of the solar module 1. The thin-film solar module 1 can absorb sunlight via the outer surface 11 in order to generate electrical power. A resultant current path is illustrated in FIG. 1 by arrows arranged in series.

For forming and for serially connecting the solar cells 12, the layer structure 3 is patterned using a suitable patterning technology, for example, laser scribing and/or mechanical ablation. For this purpose, sequences of three patterning lines P1-P2-P3 in each case are introduced into the layer structure 3. The patterning lines P1 divide at least the back electrode layer 4 into sections completely separated from one another, by which means the back electrodes of the solar cells 12 are produced. The patterning lines P2 divide at least the absorber layer 5 into sections completely separated from one another, by which means the optically active regions or absorbers of the solar cells 12 are produced. The patterning lines P3 divide at least the front electrode layer 7, by which means the front electrodes of the solar cells 12 are produced. In each case, via the second patterning lines P2, the front electrode of a solar cell 12 is electrically connected to the back electrode of an adjacent solar cell 12, wherein—as shown—the front electrode advantageously contacts the back electrode directly.

Reference is now made to FIGS. 2 and 3, wherein a schematic back view of the thin-film solar module 1 according to the invention without junction boxes (FIG. 2) as well as with junction boxes (FIG. 3) is shown.

The thin-film solar module 1 has, in plan view (or in the module plane), a rectangular shape, with a longer dimension or length L and a shorter dimension or width B. The thin-film solar module 1 includes an optically active inner region 13, which is likewise rectangular in shape, as well as an edge region 14 surrounding and delimiting the inner region 13. The inner region 13 is formed by the solar cells 12 (not shown in detail), which are arranged along the width B of the thin-film solar module 1. The area of the inner region 13 corresponds to the aperture area of the thin-film solar module 1. The solar cells 12 are connected in series between a first conductor track 15 and a second conductor track 15'. The two conductor tracks 15, 15' serve in each case as busbars for the current generated by the solar cells 12. The mutually parallel conductor tracks 15, 15' are in each case arranged in the optically inactive edge region 14 and an extend linearly along the length L of the thin-film solar module 1. Here, the conductor tracks 15, 15' are implemented, for example, in the form of thin contact strips and are made of an electrically conductive material, in particular of a metallic material such as aluminum (Al).

The optically inactive edge region 14 (completely) surrounds the optically active inner region 13 circumferentially. The layer structure 3 is removed in the edge region 14 in an edge de-coating zone 22 adjacent the module edge 31 (see FIG. 4). The edge region 14 also has a circumferential edge seal 16 adjacent the module edge 31, which edge seal prevents the entry of moisture into the thin-film solar module 1 and improves long-term stability.

As discernible in FIG. 2, the back carrier substrate 2 has a first (through) hole 17 and a second (through) hole 17', which serve for the electrical contacting of the two conductor tracks 15, 15'. In the view of FIG. 2, the two conductor tracks 15, 15' are not situated below the holes 17, 17', i.e., not in aligning extension (perpendicular to the carrier substrate 2) of the holes 17, 17'. Instead, the two holes 17, 17' are arranged completely within the inner region 13. In the example depicted in FIG. 2, the two holes 17, 17' are in each case moved inward far enough that they have a distance from the associated conductor track 15, 15' that is in the range from 1% to 10% of the distance between the two conductor tracks 15, 15'.

As discernible in FIG. 3, the thin-film solar module 1 includes a first junction box 18 and a second junction box 18'. The two junction boxes 18, 18' are in each case placed on the back 10 of the carrier substrate 2, wherein the first junction box 18 overlaps the first hole 17 and the second junction box 18' overlaps the second hole 17'. Thus, reliable sealing of the two holes 17, 17' can be achieved. The first junction box 18 has a connection cable 20; the second junction box 18', correspondingly, a connection cable 20', which serve for connecting the thin-film solar module 1 to an electrical load or for the serial connection of the thin-film solar module 1 to other modules. Situated between the two junction boxes 18, 18' is a diode cable 19 with an integrated freewheeling diode or bypass diode (not shown), which is reverse biased in the normal operating state, in which the thin-film solar module 1 delivers current. This prevents damaging the thin-film solar module 1 when no current is being produced, if, for example, due to shadowing or a module defect, no current is delivered. The current delivered by other solar modules can flow via the freewheeling diode.

Reference is now made to FIGS. 4 and 5, wherein an exemplary embodiment of the thin-film solar module 1 of FIG. 1 is illustrated, using a schematic cross-sectional representation according to section line A-A of FIG. 2 as well as a top plan view in the region of the cross-sectional representation. The components that are associated with the first conductor track 15 are described, with the components associated with the two conductor tracks 15, 15' structured analogously. The reference characters in parentheses correspond to the respective components for the second conductor track 15'.

The hole 17 (17') in the carrier substrate 2 lies completely within the inner region 13 of the thin-film solar module 1 such that optically active regions of the solar cells 12 are situated in both directions perpendicular to the cross-sectional representation of the hole 17 (17'). The conductor track 15 (15') and the edge de-coating zone 22 are situated in the optically inactive edge region 14. The conductor track 15 (15') is arranged in direct electrical contact with and directly on the back electrode layer 4. In the part of the edge region 14 reduced by the edge de-coating zone 22, the layer structure 3 is de-coated all the way to the back electrode layer 4. In the region of the edge de-coating zone 22, the layer structure 3 is completely de-coated. This can be done in a simple manner using mechanical de-coating methods known per se, which need not be discussed in detail here. No back electrode layer 4 is situated in the region of the hole 17 (17'), since this is applied on the carrier substrate 2 and was removed together with the carrier substrate 2 during the forming of the hole 17 (17').

The thin-film solar module 1 includes a flat contact element 24 (24'), implemented here in the form of a contact strip (contact bridge). The contact element 24 (24') directly contacts the back electrode layer 4, spans the hole 17 (17') completely, and extends all the way to the conductor track 15 (15'). The flat contact element 24 (24') is secured, for example, by welding, soldering, or gluing, on the back electrode layer 4 as well as on the light-entry-side surface of the conductor track 15 (15'). The flat contact element 24 (24') includes or is made of an electrically conductive material, in particular a metallic material, for example, aluminum. As discernible in FIG. 4, the flat contact element 24 (24') overlaps the conductor track 15 (15'). It would also be possible for the flat contact element 24 (24') to overlap the opposite surface of the conductor track 15 (15') facing away from the light-entry side. In this case, the flat contact element 24 (24') is first secured on the back electrode layer 4, for example, by welding, soldering, or gluing an of the back electrode layer 4 and, subsequently, the conductor track 15 (15') is secured on the contact element 24 (24'), for example, by welding, soldering, or gluing.

Electrical contacting of the flat contact element 24 (24') from the outside is done by a contact stamp 23 (23') that protrudes from the junction box 18 (18'), pushes through the hole 17 (17'), and directly contacts the surface of the flat contact element 24 (24') facing away from the light-entry side. The contact stamp 23 (23') includes or is made of an electrically conductive material, in particular a metallic material. For example, the contact stamp 23 (23') is implemented in the form of a protruding (metallic) spring. Such a design has the particular advantage that the junction box 18 (18') can be secured in a simple manner using automation on the back side 10 of the carrier substrate 2, wherein the contact stamp 23 (23') automatically comes into physical contact with the flat contact element 24 (24'). In the junction box 18 (18'), the contact stamp 23 (23') is electrically connected to the connection cable 20 (20'), for example, by a clamp or plug connection, not shown in detail in FIG. 4.

In the variant depicted in FIG. 4, the electrical connection 21 (21') between the conductor track 15 (15') and the contact stamp 23 (23') consists of the flat contact element 24 (24'), wherein the flat contact element 24 (24') electrically contacts (with physical contact) the conductor track 15 (15') at a tapping point 25 (25') and electrically contacts (with physical contact) the contact stamp 23 (23') at a connection point 26 (26'). In this case, the connection point 26 (26') is situated outside the junction box 18 (18').

Considering now, in addition, the view of FIG. 5: The inner region 13 and the edge region 14 of the thin-film solar module 1 are separately identified by boundary lines. The inner region 13 transitions at a region boundary 32 (32') into the edge region 14. The edge region 14 includes the edge de-coating zone 22, in which the edge seal 16 is implemented adjacent the module edge 31. In the edge de-coating zone 22, the layer structure 3 is completely removed all the way to the light-entry-side surface of the carrier substrate 2. Between the edge de-coating zone 22 and the inner region 13, the layer structure 3 is removed all the way to the back electrode layer 4, resulting in a de-coating zone 30 (30') that permits direct electrical contacting (with physical contact) by the conductor track 15 (15').

The hole 17 (17') in the carrier substrate 2 is positioned completely in the inner region 13 of the thin-film solar module 1, wherein the layer structure 3 is removed in the region of the hole 17 (17') all the way to the back electrode layer 4. The de-coating zone 30 (30') includes, for this purpose, a rectangular indentation 33 (33') of the inner region 13 at the region boundary 32 (32'), corresponding to a protrusion of the de-coating zone 30 (30'). This protruding portion of the de-coating zone 30 (30') can advantageously be produced during the creation of the de-coating zone 30 (30').

Through the position of the hole 17 (17') and the resultant position of the indentation 33 (33') of the inner region 13, at least one solar cell 12, here, for example, three solar cells 12, are cut short, here, for example, completely divided. For easier reference, the divided solar cells 12 are identified with "A"; the undivided solar cells 12 with "B". Each solar cell A is divided by the hole 17 (17') or indentation 33 (33') of the inner region 13 into two sub-cells 12-1, 12-2.

Each solar cell A has an optically active (total) area resulting from the sum of the optically active areas of the two sub-cells 12-1, 12-2. All solar cells A have an optically active (total) area of the same size. Moreover, all solar cells B have an optically active area of the same size. As discernible in FIG. 5, the sub-cells 12-1, 12-2 of the solar cells A have a greater width than the solar cells B, with their width enlarged such that the solar cells A and the solar cells B have an optically active area of the same size. This means that the two sub-cells 12-1, 12-2 of a solar cell A have, in total, an optically active area that corresponds to the optically active area of one solar cell B. Thus, it can be advantageously achieved that the solar cells can be operated at at least almost the same operating point on their characteristic curve such that the efficiency of the solar cells A is not degraded relative to the solar cells B.

The contact element 24 (24') overlapping the hole 17 (17') is a contact bridge with an elongated shape, here, for example, a rectangular shape. To avoid an electrical short-circuit of the solar cells A by the contact element 24 (24'), inside the indentation 33 (33'), a first layer section 28 (28') of the back electrode layer 4, which contacts the contact element 24 (24'), is electrically isolated from a second layer section 29 (29') of the back electrode layer 4 by a separating line 27 (27'). For this purpose, the separating line 27 (27') surrounds the contact element 24 (24') like a frame in the inner region 13 or within the indentation 33 (33'). The separating line 27 (27') cuts through the back electrode layer 4 in its full layer thickness such that the first layer section 28 (28') and the second layer section 29 (29') are completely isolated electrically from one another in the inner region 13. At the module level, the separating line 27 (27') has a (small) distance from the contact element 24 (24'), but could, however, also be directly adjacent the contact element 24 (24'). The separating line 27 (27') is, in any case, implemented in the inner region 13, by which means satisfactory electrical isolation of the first layer section 28 (28') from the second layer section 29 (29') is achieved. In the embodiment of FIG. 5, the separating line 27 (27') extends slightly into the edge region 14, but could, however, also extend all the way to the conductor track 15 (15'), by which means complete electrical isolation of the first layer section 28 (28') from the second layer section 29 (29') is obtained both in the inner region 13 and in the edge region 14.

Reference is now made to FIG. 6, wherein another exemplary embodiment of the thin-film solar module 1 is illustrated, using a schematic cross-sectional representation according to section line A-A of FIG. 2. In order to avoid unnecessary repetitions, only the differences relative to the preceding exemplary embodiment are explained and, otherwise, reference is made to the statements made above.

In the variant depicted in FIG. 6, in contrast to the preceding variant, the contact element 24 (24') does not extend all the way to the conductor track 15 (15'), but, instead, has a distance from the conductor track 15 (15'). An electrical connection between the contact element 24 (24') and the conductor track 15 (15') is done by a contact section 34 (34') of the back electrode layer 4, which is situated between the contact element 24 (24') and the conductor track 15 (15'). Accordingly, the electrical connection 21 (21') between conductor track 15 (15') and contact stamp 23 (23') is composed of the contact element 24 (24') and the contact section 34 (34') of the back electrode layer 4. The tapping point 25 (25') on the conductor track 15 (15') results from that point at which the conductor track 15 (15') rests against the contact section 34 (34') of the back electrode layer 4 in physical contact.

Reference is now made to FIG. 7, wherein another exemplary embodiment of the thin-film solar module 1 according to the invention is illustrated, using a schematic cross-sectional representation according to section line A-A of FIG. 2. In order to avoid unnecessary repetitions, only the differences relative to the preceding exemplary embodiment are explained and, otherwise, reference is made to the statements made above.

Accordingly, the thin-film solar module 1 includes a flat contact element 24 (24'), which is implemented in the form of an end section 36 (36') of the conductor track 15 (15'). For this purpose, the conductor track 15 (15') is, for example, folded at a right angle (not discernible in the cross-sectional representation of FIG. 7), routed in the direction of the hole 17 (17'), and threaded through the hole 17 (17'). Electrical contacting of the end section 36 (36') is done in the junction box 18 (18'), which has, for this purpose, a connection element 35, for example, in the form of a clamp or a crimp. In the variant depicted in FIG. 7, the electrical connection 21 (21') between conductor track 15 (15') and junction box 18 (18') consists of the end section 36 (36') of the conductor track 15 (15'). The point at which the conductor track 15 (15') is folded and deviates from the course in the direction of the longitudinal dimension L is the tapping point 25 (25'). The connection point 26 (26') is that point at which the end section 36 (36') transitions into the connection element 35. In this variant of the invention, an additional flat contact element, as well as a contact stamp, can be dispensed with. As depicted in FIG. 7, the end section 36 (36') can rest directly on the back electrode layer 4. However, it is also conceivable for the layer structure 3 to be completely de-coated in the region of the end section 36 (36').

Reference is now made to FIG. 8, wherein a fourth variant of the thin-film solar module 1 according to the invention is illustrated, using a schematic cross-sectional representation in plan view. In order to avoid unnecessary repetitions, only the differences relative to the preceding exemplary embodiments are explained and, otherwise, reference is made to the statements made above.

Accordingly, the thin-film solar module 1 includes a flat contact element 24 (24'), which is implemented in the form of an intermediate section intermediate section 37 (37') of the conductor track 15 (15'). For this purpose, the conductor track 15 (15') is folded in an inward positioned region multiple times, for example, at a right angle, routed in the direction of the hole 17 (17'), and threaded through the hole 17 (17'). Electrical contacting of the intermediate section 37 (37') is done analogously to the variant of FIG. 7 in the junction box 18 (18'). In the variant depicted in FIG. 8, the electrical connection 21 (21') between conductor track 15 (15') and junction box 18 (18') consists of the intermediate section 37 (37') of the conductor track 15 (15'). The point at which the conductor track 15 (15') is folded for the first time and deviates from the course in the direction of the longitudinal dimension L is the tapping point 25 (25'). The connection point is that point at which the intermediate section 37 (37') transitions into the connection element 35 (not depicted in FIG. 8). The intermediate section 37 (37') can rest directly on the back electrode layer 4. However, it is also conceivable for the layer structure 3 to be completely de-coated in the region of the intermediate section 37 (37').

Reference is now made to FIG. 9, wherein a fifth variant of the thin-film solar module 1 according to the invention is illustrated, using a schematic representation in plan view.

The variant depicted in FIG. 9 is a modification of the variant of FIG. 5. In order to avoid unnecessary repetitions, only the differences relative to this variant are explained and, otherwise, reference is made to the statements made above.

The modification of FIG. 9 differs from FIG. 5 in that three solar cells 12 are completely divided and a fourth solar cell 12 is cut short (i.e., not completely divided) by the indentation 33 (33') of the inner region 13. The contact element 24 (24') overlapping the hole 17 (17') is a contact bridge with an elongated shape and rounded corners.

As emerges from the above description of the invention, the position of the two holes 17, 17' is situated in the carrier substrate 2 inside the inner region 13 such that the two conductor tracks 15, 15' can be positioned farther on the module edge 31 of the thin-film solar module 1. To be sure, on the one hand, the optically active area of the solar cells A is reduced by the indentations 33, 33';

however, this disadvantage can be overcompensated by the further outward positioned conductor tracks 15, 15' such that the aperture area as a whole can be enlarged.

This can be clarified using an exemplary calculation: For example, the width of the edge seal 16 can be narrowed from the current 12.5 mm to 6 mm. This increases the aperture area by 2*6.5 mm*1560 mm (=202 cm$^2$). The indentations 33, 33' of the inner region 13 again reduce this gain. With a hole diameter of 4 mm and a width of the flat contact element 24, 24' of 4 mm+3×3 mm=10 mm (+3 mm for the mechanical/electrical contact), it can be assumed that the cell area in the indentation 33, 33' is reduced by approx. 2×10 mm×10 mm=2 cm$^2$. Thus, there remains a net gain of approx. 200 cm$^2$. With an aperture area von 9600 cm$^2$, this corresponds to an increase in module output by 2% or 3 Watts for a module of 150 W. In this case, the material costs are increased only marginally, while additional steps for patterning the layer structure 3 and, optionally, for the application of the flat contact element 24, 24' are necessary.

As discernible from the position of the holes 17, 17' in FIG. 1, the tapping points 25, 25' are situated roughly in the center of the two conductor tracks 15, 15'. Thus, ohmic losses in the conductor tracks 15, 15' can be reduced, since the length of the current path along the conductor tracks 15, 15' is shortened. This enables a reduction of the cross-sectional area of the conductor tracks 15, 15' in particular by reducing their width such that the aperture area can be further enlarged in a particularly advantageous manner.

The invention makes available an improved solar module with an enlarged aperture area that enables, in comparison with prior art modules of the same module size, higher power generation, without disadvantageously impacting the long-term stability and service life of the solar module. The steps necessary for producing the solar module can be realized in a simple manner in existing plants.

LIST OF REFERENCE CHARACTERS

1 thin-film solar module
2 carrier substrate
3 layer structure
4 back electrode layer
5 absorber layer
6 buffer layer
7 front electrode layer
8 adhesive layer
9 covering
10 back side
11 front side
12 solar cell
12-1, 12-2 sub-cell
13 inner region
14 edge region
15, 15' conductor track
16 edge seal
17, 17' hole
18, 18' junction box
19 diode cable
20, 20' connection cable
21, 21' electrical connection
22 edge de-coating zone
23, 23' contact stamp
24, 24' flat contact element
25, 25' tapping point
26, 26' connection point
27, 27' separating line
28, 28' first layer section
29, 29' second layer section
30, 30' de-coating zone
31 module edge
32, 32' region boundary
33, 33' indentation
34, 34' contact section
35 connection element
36, 36' end section
37, 37' intermediate section

What is claimed is:

1. A solar module, comprising: a substrate having a flat geometry; and solar cells connected in series between two conductor tracks and arranged on a first side of the substrate of the solar module, the two conductor tracks extend along a first dimension of the solar module or the substrate of the solar module, an optically active inner region surrounded by an optically inactive edge region, wherein a junction box on a second side of the substrate, and an electrical connection between a tapping point on the conductor track and a connection point of the junction box are associated with each conductor track, and wherein i) each tapping point is situated in the center of each conductor track and ii) at least one solar cell is divided into two solar sub-cells or has a shortened length;
   wherein the electrical connection has a flat contact element electrically connected to the conductor track;
   wherein the flat contact element contacts a section of a back electrode layer electrically connected to the conductor track, wherein a separating line cuts through the back electrode layer in a full layer thickness and partially surrounds the flat contact element in a region where the connection point is located;
   wherein the substrate comprises at least one hole positioned offset from each conductor track and positioned perpendicular to a lengthwise direction of the junction box.

2. The solar module according to claim 1, comprising a layer structure applied on the substrate, the layer structure comprising the back electrode layer, a front electrode layer, and an absorber layer arranged between the back and the front electrode layer, wherein all layers are removed or not applied up to at least the back electrode layer in the region where the connection point is located.

3. The solar module according to claim 2, wherein the region where the connection point is located is partially surrounded by the at least one solar cell in a rectangular shape.

4. The solar module according to claim 1, wherein the flat contact element is electrically contacted by a contact stamp of the junction box pushing through the substrate, wherein the contact stamp protrudes from the junction box and directly contacts a surface of the flat contact element facing away from a light-entry side.

5. The solar module according to claim 1, wherein, at least in the optically active inner region, the section of the back electrode layer is electrically separated from a remaining section of the back electrode layer by the separating line cutting through the back electrode layer.

6. The solar module according to claim 1, wherein the flat contact element is physically spaced apart from the conductor track.

7. The solar module according to claim 1, wherein the flat contact element is in physical contact with the conductor track.

8. The solar module according to claim 7, wherein the flat contact element overlaps the conductor track.

9. The solar module according to claim 1, wherein the electrical connection comprises an end section extending diagonally or at a right angle relative to the dimension of the substrate or an intermediate section of the conductor track, wherein either of the end section or the intermediate section is routed through the second side of the substrate.

10. The solar module according to claim 2, wherein the electrical connection comprises an end section positioned at a right angle relative to the dimension of the substrate or relative to an intermediate section of the conductor track, routed through the second side of the substrate.

11. The solar module according to claim 1, wherein each associated tapping point is spaced at a distance from an end of the conductor track that corresponds to 20% to 50% of a length of each associated conductor track.

12. The solar module according to claim 1, wherein all solar cells have an optically active area of the same size.

13. The solar module according to claim 4, wherein the contact stamp is implemented in the form of a protruding spring that automatically comes into physical contact with the flat contact element.

\* \* \* \* \*